(12) United States Patent
Nian et al.

(10) Patent No.: US 10,147,626 B2
(45) Date of Patent: Dec. 4, 2018

(54) WAFER CASSETTE AND PLACEMENT METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Si Jun Nian, Shanghai (CN); Tzu Chieh Chien, Shanghai (CN); Xiao Jin Li, Shanghai (CN); Pan Lin Dong, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/477,139

(22) Filed: Apr. 3, 2017

(65) Prior Publication Data

US 2017/0301570 A1 Oct. 19, 2017

(30) Foreign Application Priority Data

Apr. 18, 2016 (CN) .......................... 2016 1 0239031

(51) Int. Cl.
*H01L 21/677* (2006.01)
*H01L 21/673* (2006.01)

(52) U.S. Cl.
CPC ...... *H01L 21/6773* (2013.01); *H01L 21/6732* (2013.01); *H01L 21/6779* (2013.01);
(Continued)

(58) Field of Classification Search
CPC ............ H01L 21/6773; H01L 21/6779; H01L 21/67383; H01L 21/67763; H01L 21/67778; H01L 21/67781
(Continued)

(56) References Cited

U.S. PATENT DOCUMENTS 4,536,122 A * 8/1985 Herrmann ............... H01L 21/67
414/404
5,240,557 A * 8/1993 Dyer ................. H01L 21/67781
414/589
(Continued)

FOREIGN PATENT DOCUMENTS

JP S5860554 A 4/1983

OTHER PUBLICATIONS

The European Patent Office (EPO) The Extended European Search Report for 17166515.1 dated Sep. 14, 2017 8 Pages.

*Primary Examiner* — Steven A. Reynolds
(74) *Attorney, Agent, or Firm* — Anova Law Group, PLLC

(57) ABSTRACT

A wafer cassette and a method for placing a wafer are provided. The wafer cassette includes a box body including a plurality of groups of card slots formed on sidewalls of the box body. Each group of the card slots is configured to hold a wafer and includes a wafer input terminal. The wafer cassette also includes a guide device including a plurality of groups of guide slots configured to be docked to the wafer input terminals. Each group of the guide slots and a docking group of the card slots are formed at a same floor.

20 Claims, 3 Drawing Sheets

(52) U.S. Cl.
CPC .. *H01L 21/67383* (2013.01); *H01L 21/67763* (2013.01); *H01L 21/67775* (2013.01); *H01L 21/67778* (2013.01); *H01L 21/67781* (2013.01)

(58) Field of Classification Search
USPC .................................. 206/710, 711; 414/404
See application file for complete search history.

(56) References Cited

U.S. PATENT DOCUMENTS

| | | | | |
|---|---|---|---|---|
| 5,382,128 | A | * | 1/1995 | Takahashi ......... H01L 21/68707 118/500 |
| 5,730,575 | A | * | 3/1998 | Nichols ............. H01L 21/67775 118/500 |
| 5,735,662 | A | * | 4/1998 | Nichols ............. H01L 21/67778 211/1.57 |
| 5,975,836 | A | | 11/1999 | Rodriguez |
| 7,771,157 | B2 | * | 8/2010 | Farrell .............. H01L 21/67781 414/404 |
| 8,303,231 | B2 | * | 11/2012 | Yu .................... H01L 21/67772 414/217 |

* cited by examiner

WAFER CASSETTE AND PLACEMENT METHOD THEREOF

CROSS-REFERENCES TO RELATED APPLICATIONS

This application claims the priority of Chinese patent application No. 201610239031.1, filed on Apr. 18, 2016, the entirety of which is incorporated herein by reference.

FIELD OF THE INVENTION

The present invention generally relates to the field of semiconductor equipment technology and, more particularly, relates to a wafer cassette and placement method thereof.

BACKGROUND

During a semiconductor fabrication process, a wafer needs to be transferred between different manufacturing processes, as well as between different regions of the same manufacturing process. A wafer cassette is often used in both the transportation and storage processes. The wafer cassette can provide a clean environment for holding the wafer, and avoid contaminations on the wafer from contamination sources in the manufacturing environment which may have a lower cleanliness level compared to the wafer cassette.

To improve utilization of the wafer cassette, a plurality of wafers are usually stored in one wafer cassette. The wafer cassette has a plurality of card slots. The card slots can divide and support the wafers, thus the bottom of the wafer is suspended and the wafers are placed in an orderly manner in the wafer cassette. When the equipment the manufacturing process fails or needs maintenance, the wafers need to be placed in the wafer cassette by a manual operation.

However, when manually placing the wafers in an existing wafer cassette, the wafers are easily scratched. The disclosed device structures and methods are directed to solve one or more problems set forth above and other problems.

BRIEF SUMMARY OF THE DISCLOSURE

One aspect of the present disclosure includes a wafer cassette. The wafer cassette includes a box body including a plurality of groups of card slots formed on sidewalls of the box body. Each group of the card slots is configured to hold a wafer and includes a wafer input terminal. The wafer cassette also includes a guide device including a plurality of groups of guide slots configured to be docked to the wafer input terminals. Each group of the guide slots and a docking group of the card slots are formed at a same floor.

Another aspect of the present disclosure includes a method of placing wafers. The method includes providing a plurality of wafers. The method also includes placing a wafer on a group of guide slots. In addition, the method includes sliding the wafer onto a corresponding group of card slots through the group of the guide slots. Further, the method includes repeating the steps of placing another wafer on the guide slots and sliding the another wafer onto the corresponding card slots until all of the plurality of wafers are placed on the card slots.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Figure 1:
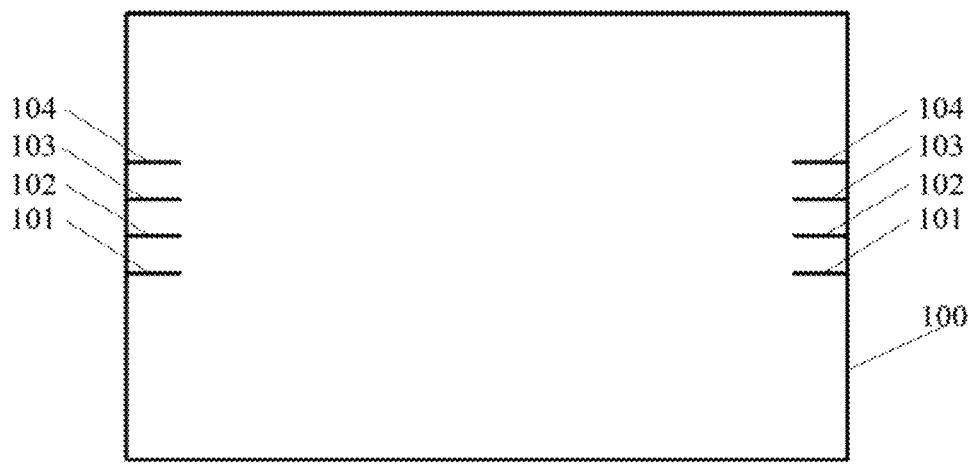
FIG. 1 illustrates an existing wafer cassette.

Referring to FIG. 1, in one embodiment, a wafer cassette includes a box body 100, and a plurality of groups of card slots formed on both sidewalls of the box body 100. The card slots in each group are configured facing toward each other and formed at the same floor. Each group of the card slots is configured to hold and/or secure a wafer.

Referring to FIG. 1, the number of groups of the card slots is four as an example. Specifically, the card slots include a first group of the card slots 101, a second group of the card slots 102 formed above the first group of the card slots 101, a third group of the card slots 103 formed above the second group of the card slots 102, and a fourth group of the card slots 104 formed above the third group of the card slots 103.

When the equipment in the manufacturing process fails or needs maintenance, the wafers need to be placed in the wafer cassette by a manual operation. The wafers may be easily scratched when manually placing the wafers in the wafer cassette. Reasons for the described issue include the following.

Figure 2:
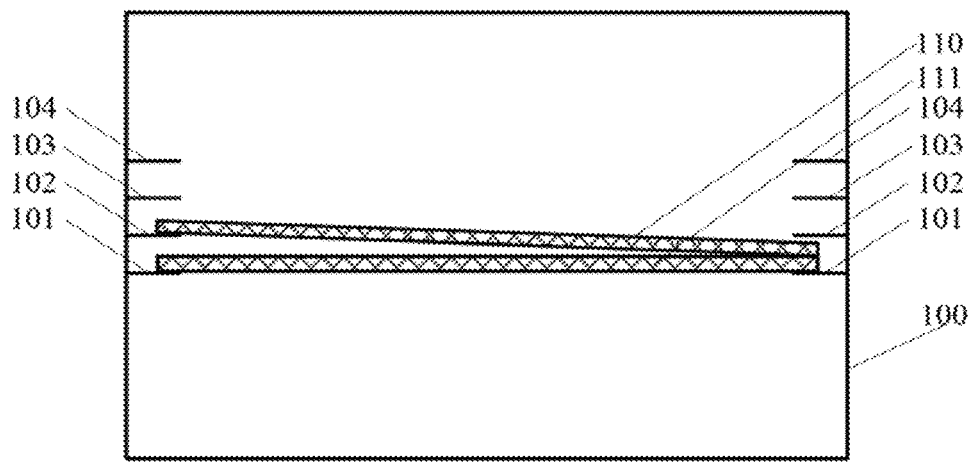
FIG. 2 illustrates a schematic diagram of an abnormal placement of a wafer in an existing wafer cassette.

On the one hand, the distance between the card slots in adjacent floors is too small, generally in a range of approximately 5 mm-10 mm. Therefore, it is easy to place the wafer on the card slots in different floors and mutually staggered, and to place the adjacent wafers on the card slots at the same floor in one side. FIG. 2 illustrates a schematic diagram of an abnormal placement of the wafer in the existing wafer cassette. Referring to FIG. 2, a wafer 111 is placed on the first group of the card slots 101. One side of a wafer 110 is placed on one side of the second group of the card slots 102, and another side of the wafer 110 is placed on one side of the first group of the card slots 101. Therefore, the wafer 110 can rub and collide with the wafer 111, easily causing the wafers to scratch each other.

On the other hand, even if the wafer is placed on the card slots at the same floor and without misalignment, a large angle between the wafer and an extension direction of the card slots placing the wafer easily occurs when manually sliding the wafer onto the card slots. Therefore, the adjacent wafers can contact and scratch each other.

Figure 3:
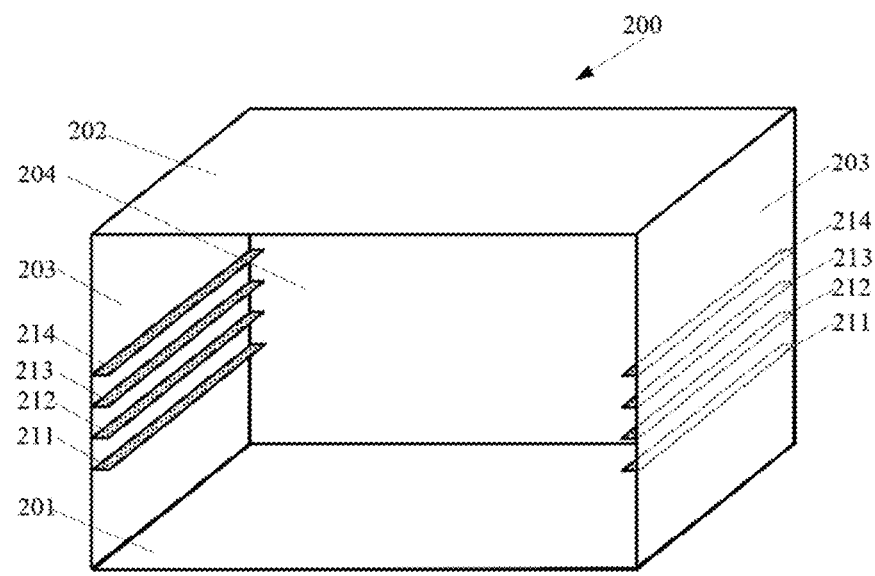
FIGS. 3-5 illustrate structures corresponding to certain stages to form an exemplary wafer cassette consistent with various disclosed embodiments of the present disclosure.
Figure 4:
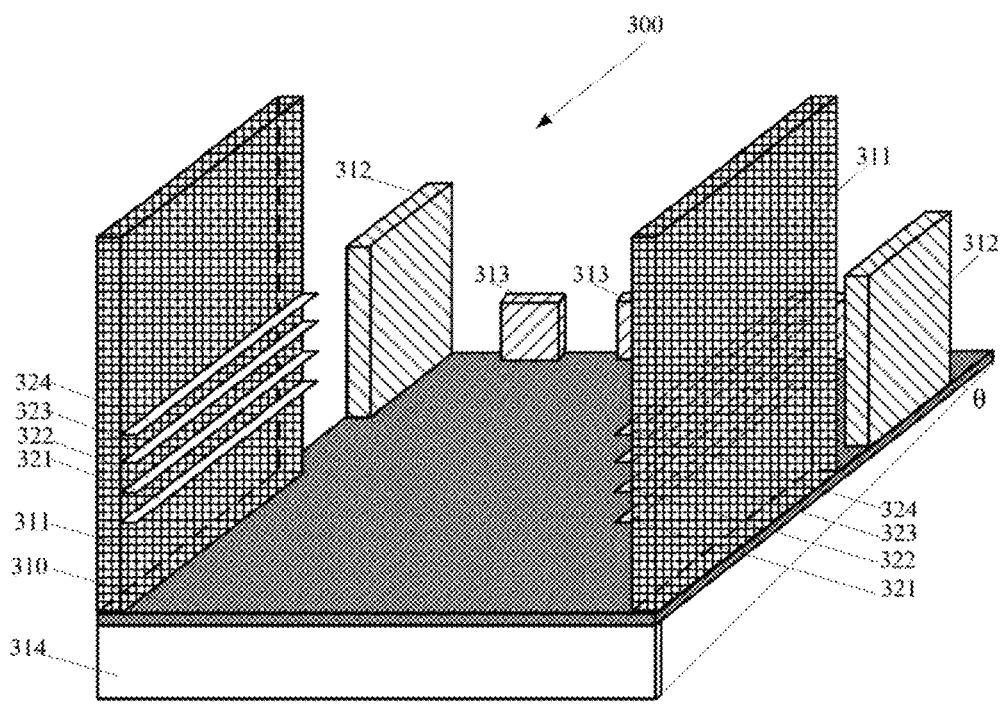
Figure 5:
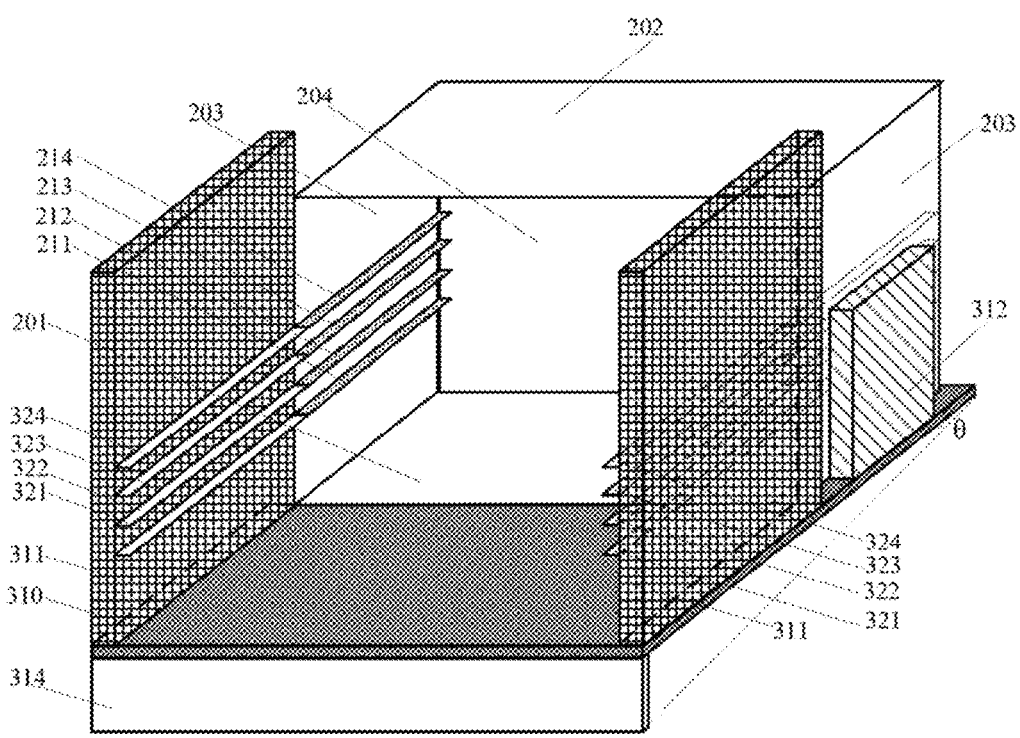

The present disclosure provides a wafer cassette. FIGS. 3-5 illustrate structures corresponding to certain stages to form an exemplary wafer cassette consistent various disclosed embodiments of the present disclosure.

Referring to FIG. 3, an exemplary wafer cassette may include a box body 200, and a plurality of groups of card slots formed on both sidewalls of the box body 200. The card slots may be configured to hold a wafer to be placed. The card slots may include a wafer input terminal.

Although FIG. 3 shows four groups of the card slots formed on the sidewalls of the box body 200, any number, e.g., less than or more than four, of groups of the card slots may be formed on the sidewalls of the box body 200. The card slots may include a first group of the card slots 211, a second group of the card slots 212 formed above the first group of the card slots 211, a third group of the card slots 213 formed above the second group of the card slots 212, and a fourth group of the card slots 214 formed above the third group of the card slots 213. In certain embodiments, the number of groups of the card slots may be selected based on the specific situation.

In various embodiments, card slots in any one group may be paired, grouped, or otherwise configured for placing a wafer thereon. For example, the card slots in each group may be formed at a same level, or sometimes same floor, suitable for holding a wafer. In one embodiment, the card slots in the first group 211 may be formed at the same floor, the card slots in the second group 212 may be formed at the same floor, the card slots in the third group 213 may be formed at the same floor, and the card slots in the fourth group 214 may be formed at the same floor.

In one embodiment, the number of the card slots in each group may be two as an example, while in other embodiments, the number of the card slots in each group may be three, four, or any other suitable numbers. When the number of the card slots in each group is two, the card slots in each soup may be configured facing toward each other.

In one embodiment, the distance between the card slots in adjacent floors may be in a range of approximately 5 mm-10 mm. The box body 200 and the card slots may be made of a metal, such as stainless steel.

The card slots may be configured to hold and/or secure the wafer to be placed in place. Each group of the card slots may be configured to place one piece of the wafer. One piece of the wafer may be placed on one group of the card slots in the same floor. For example, one piece of the wafer may be placed on the first group of the card slots 211, the second group of the card slots 212, the third group of the card slots 213, or the fourth group of the card slots 214.

The card slots may include the wafer input terminal. The wafer input terminal may be configured as a starting terminal where the wafer slides onto the card slots. Specifically, each group of the card slots may include a corresponding wafer input terminal. In one embodiment, the first group of the card slots 211 may include a first wafer input terminal, the second group of the card slots 212 may include a second wafer input terminal, the third group of the card slots 213 may include a third wafer input terminal, and the fourth group of the card slots 214 may include a fourth wafer input terminal.

The box body 200 may include a box bottom layer 201, a box top layer 202 configured facing toward the box bottom layer 201, and a box sidewall formed between and in contact with the box bottom layer 201 and the box top layer 202. The box bottom layer 201, the box top layer 202, and the box sidewall may form a semi-closed box body. Thus, the box body 200 may include a window. The window may be formed between the box bottom layer 201 and the box top layer 202.

In one embodiment, the shape of the box body 200 may be, for example, a square body, although the box body 200 may have any suitable shape. The square body may be a cube or a cuboid. The box sidewall may include a first box sidewall 203 and a second box sidewall 204. The first box sidewall 203 may be formed at both sides of the second box sidewall 204 and perpendicular to the second box sidewall 204. The first box sidewall 203 may be formed at side of the window, and the second box sidewall 204 may be configured facing toward the window.

The card slots may be formed on the box sidewall. In one embodiment, the number of the card slots in each group may be two. All the first group of the card slots 211, the second group of the card slots 212, the third group of the card slots 213, and the fourth group of the card slots 214 may be formed on the first box sidewall 203. In certain embodiments, all the first group of the card slots 211, the second group of the card slots 212, the third group of the card slots 213, and the fourth group of the card slots 214 may be formed on the first box sidewall and the second box sidewall.

Referring to FIG. 4, the wafer cassette may also include a guide device 300. The guide device 300 may include a plurality of groups of guide slots. The guide slots may be configured to be docked to the wafer input terminal. Each group of the guide slots and a docking group of the card slots may be formed at the same floor. The number of groups of the guide slots may be equal to the number of groups of the card slots.

Although FIG. 4 shows four groups of the guide slots, any number, e.g., less than or more than four, of groups of the guide slots may be formed. Specifically, the guide slots may include a first group of the guide slots 321, a second group of the guide slots 322 formed above the first group of the guide slots 321, a third group of the guide slots 323 formed above the second group of the guide slots 322, and a fourth group of the guide slots 324 formed above the third group of the guide slots 323. In certain embodiments, the number of groups of the guide slots may be selected based on the specific requirement.

In various embodiments, guide slots in any one group may be paired, grouped, or otherwise configured for placing a wafer thereon. For example, the guide slots in each group may be formed at a same level, or sometimes same floor, suitable for holding a wafer. In one embodiment, the guide slots in the first group 321 may be formed at the same floor, the guide slots in the second group 322 may be formed at the same floor, the guide slots in the third group 323 may be formed at the same floor, and the guide slots in the fourth group 324 may be formed at the same floor.

The distance between the guide slots in adjacent floors may be the same as the distance between the card slots in adjacent floors. In one embodiment, the number of the guide slots in each group may be two as an example, while in other embodiments, the number of the guide slots in each group may be three, four, or any other suitable numbers. When the number of the guide slots in each group is two, the guide slots in each group may be configured facing toward each other.

The guide slots may be configured to be docked to the wafer input terminals of the card slots. In one embodiment, the first group of the guide slots 321 may be docked to the first wafer input terminal, the second group of the guide slots 322 may be docked to the second wafer input terminal, the third group of the guide slots 323 may be docked to the third wafer input terminal, and the fourth group of the guide slots 324 may be docked to the fourth wafer input terminal.

Each group of the guide slots and the docking group of the card slots may be formed at the same floor. In one embodiment, the first group of the card slots 211 and the first group of the guide slots 321 may be formed at the same floor, the second group of the card slots 212 and the second group of the guide slots 322 may be formed at the same floor, the third group of the card slots 213 and the third group of the guide slots 323 may be formed at the same floor, and the fourth group of the card slots 214 and the fourth group of the guide slots 324 may be formed at the same floor.

In one embodiment, when the number of the guide slots in each group is two, the guide slots in each group may be configured facing toward each other. At this time, the guide slots may be configured to be docked to the wafer input terminal along a longitudinal direction of the card slots. In one embodiment, the first group of the guide slots 321 may be docked to the wafer input terminal of the first group of the card slots 211 along the longitudinal direction of the first group of the card slots 211. The second group of the guide slots 322 may be docked to the wafer input terminal of the second group of the card slots 212 along the longitudinal direction of the second group of the card slots 212. The third group of the guide slots 323 may be docked to the wafer input terminal of the third group of the card slots 213 along the longitudinal direction of the third group of the card slots 213. The fourth group of the guide slots 324 may be docked to the wafer input terminal of the fourth group of the card slots 214 along the longitudinal direction of the fourth group of the card slots 214.

When the guide slots is configured to be docked to the wafer input terminal along the longitudinal direction of the card slots, the length of the guide slots may need to be selected in a suitable range with respect to the length of the card slots. If the length of the guide slots is too long with respect to the length of the card slots, it may waste materials. If the length of the guide slots is too small with respect to the length of the card slots, it may cause the support area provided to the wafer before sliding the wafer onto the card slots to be too small, thus the wafer cannot be effectively supported by the guide slots. In one embodiment, the length of the guide slots may be approximately 0.5-4.5 times of the length of the card slots.

The guide slots may include front-guide and back-guide terminals configured on opposite sides. The back-guide terminal may be configured to be docked to the wafer input terminal. The front-guide terminal may be affixed with a label. The labels affixed to the front-guide terminals in the same group of the guide slots may be the same, and the labels affixed to the front-guide terminals in different groups of the guide slots may be different. The label may be marked with an identification symbol. The identification symbol may be a number, a letter, a geometric figure, or other symbols that can be used for identification.

In one embodiment, the guide device 300 may also include a bottom plate 310 configured to accommodate the box body 200 (shown in FIG. 3). Specifically, the upper surface of the bottom plate 310 may be configured in contact with the box bottom layer 201.

In addition, the guide device 300 may include a first guide plate 311 formed on the bottom plate 310. The first guide plate 311 may be configured to be docked to the box sidewall at the side of the window. In one embodiment, the first guide plate 311 may be configured to be docked to the first box sidewall 203. The guide slots may be formed on the inner sidewall of the first guide plate 311.

Moreover, the guide device 300 may include a side plate formed on the bottom plate 310 and configured to hold and/or secure the box body 200. The inner sidewall of the side plate may be configured in contact with the box sidewall.

The side plate may include a first side plate 312. The first side plate 312 may be formed on the bottom plate 310. The inner sidewall of the first side plate 312 may be configured in contact with the first box sidewall 203. The size of the first side plate 312 in a direction perpendicular to the bottom plate 310 may be smaller than the size of the box sidewall in the direction perpendicular to the bottom plate 310. Therefore, the frictional force between the first side plate 312 and the box sidewall may be small when subsequently placing the box body 200 on the bottom plate 310. Specifically, the size of the first side plate 312 in the direction perpendicular to the bottom plate 310 may be in a range of approximately 80 mm-120 mm, including 80 mm, 100 mm, or 120 mm, etc.

The side plate may also include a second side plate 313. The second side plate 313 may be formed on the bottom plate 310. The inner sidewall of the second side plate 313 may be configured in contact with the second box sidewall 204. The size of the second side plate 313 in the direction perpendicular to the bottom plate 310 may be smaller than the size of the box sidewall in the direction perpendicular to the bottom plate 310. Therefore, the frictional force between the second side plate 313 and the box sidewall may be small when subsequently placing the box body 200 on the bottom plate 310. Further, the size of the second side plate 313 in the direction perpendicular to the bottom plate 310 may be smaller than the size of the first side plate 312 in the direction perpendicular to the bottom plate 310, to further facilitate subsequently placing the box body 200 on the bottom plate 310. Specifically, the size of the second side plate 313 in the direction perpendicular to the bottom plate 310 may be in a range of approximately 15 mm-25 mm, including 15 mm, 20 mm, or 25 mm, etc.

Further, the guide device 300 may include a support plate 314. The support plate 314 may be formed under the bottom plate 310. The support plate 314 may be configured to set the bottom plate 310 in one side toward the window higher than the bottom plate 310 in the other side back to the window after accommodating the box body 200 by the bottom plate 310.

The bottom plate 310 may include leading edge and trailing edge configured on opposite sides. The window may be configured facing toward the leading edge after accommodating the box body 200 by the bottom plate 110. The support plate 314 may be firmed under the bottom plate 310 and in contact with the leading edge of the bottom plate 310. The support plate 314 may be perpendicular to the bottom plate 310. Or an angle formed between the support plate 314 and the bottom plate 310 may be an acute angle or an obtuse angle.

Referring to FIG. 4, the support plate 314 may tilt the bottom plate 310. An inclination angle θ may be formed between the bottom plate 310 and the horizontal plane. The inclination angle θ of the bottom plate 310 may need to be selected in a suitable range. When manually placing the wafer in the wafer cassette, a suitable viewing angle may be provided to accurately place the wafer on one group of the guide slots at the same floor. Therefore, the inclination angle θ of the bottom plate 310 may be in a range of approximately 25 degrees-35 degrees, including 25 degrees, 30 degrees, or 35 degrees, etc.

Because the bottom plate 300 may be tilted by the support plate 314, the front-guide terminal of the guide slots may be higher than the back guide terminal of the guide slots, to facilitate recognizing the position of the guide slots and placing the wafer on the guide slots. After subsequently placing the box body 200 on the bottom plate 310 of the guide device 300, the window of the box body 200 may be tilted backward and the wafer may be slid onto the inclined card slots through the inclined guide slots, to facilitate placing the wafer on the card slots.

The bottom plate 310, the first guide plate 311, the first side plate 312, the second side plate 313 and the guide slots may be made of a metal, such as stainless steel.

The guide device 300 and the box body 200 may need to be assembled together for operation. Referring to FIG. 5, the box body 200 may be placed on the bottom plate 310. After assembling the guide device 300 and the box body 200, the guide slots may be docked to the wafer input terminals of the card slots. Each group of the guide slots and the docking group of the card slots may be formed at the same floor.

Specifically, in one embodiment, the first group of the guide slots 321 may be docked to the first wafer input terminal, the second group of the guide slots 322 may be docked to the second wafer input terminal, the third group of the guide slots 323 may be docked to the third wafer input terminal, and the fourth group of the guide slots 324 may be docked to the fourth wafer input terminal. The first group of the card slots 211 and the first group of the guide slots 321 may be formed at the same floor, the second group of the card slots 212 and the second group of the guide slots 322 may be formed at the same floor, the third group of the card slots 213 and the third group of the guide slots 323 may be formed at the same floor, and the fourth group of the card slots 214 and the fourth group of the guide slots 324 may be formed at the same floor.

After assembling the guide device 300 and the box body 200, the first guide plate 311 may be docked to the first box sidewall 203, and the inner sidewall of the side plate may be configured in contact with the box sidewall to hold and/or secure the box body 200 on the bottom plate 310. In one embodiment, the inner sidewall of the first side plate 312 may be configured in contact with the first box sidewall 203, and the inner sidewall of the second side plate 313 may be configured in contact with the second box sidewall 204.

Because the guide device includes a plurality of groups of the guide slots, the guide slots are configured to be docked to the wafer input terminals, and each group of the guide slots and the docking group of the card slots are formed at the same floor, the wafer can be slid onto the card slots through the guide slots. Because the wafer can be slid onto the card slots through the guide slots, on the one hand, when the wafer is correctly placed on the guide slots, the wafer can be held parallel to the card slots before being slid onto the card slots. Therefore, the occurrence of a large angle between the wafer and the card slots placing the wafer may be avoided when manually placing the wafer in the wafer cassette, preventing the wafer on the card slots at one floor from scratching against the wafer on the card slots at the adjacent floor. On the other hand, when the wafer is placed on the guide slots at different floors and mutually staggered, because the wafer on the guide slots cannot touch the wafers already placed on the card slots, an opportunity may be provided to replace the wafer, avoiding the wafers to scratch each other.

Correspondingly, a method of placing wafers is also provided. The method may include: providing a plurality of wafers; placing a wafer on a group of the guide slots; sliding the wafer onto a corresponding group of the card slots through the group of the guide slots; and repeating the steps of placing another wafer on the guide slots and sliding the another wafer onto the corresponding card slots until all of the plurality of wafers are placed on the card slots.

In the method of placing wafer consistent with the disclosed embodiments, each wafer may be slid onto a corresponding group of the card slots through a group of the guide slots, thus the wafer can be held parallel to the card slots before being slid onto the card slots. Therefore, the occurrence of the large angle between the wafer and the card slots placing the wafer may be avoided when manually placing the wafer in the wafer cassette, preventing the wafer on the card slots at one floor from scratching against the wafer on the card slots at the adjacent floor.

The above detailed descriptions only illustrate certain exemplary embodiments of the present invention, and are not intended to limit the scope of the present in invention. Those skilled in the art can understand tree specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A wafer cassette, comprising:
   a box body including a plurality of groups of card slots formed on sidewalls of the box body, wherein each group of the card slots is configured to hold a wafer and includes a wafer input terminal; and
   a guide device including a plurality of groups of guide slots configured to be docked to the wafer input terminals, wherein each group of the guide slots and a docking group of the card slots are formed at a same height, wherein:
   the guide device includes a bottom plate,
   the guide device includes first guide plates and side plates, wherein:
     the side plates include first side plates and second side plates on top of the bottom plate,
     a height of the first guide plates is bigger than a height of the first side plates, and
     a height of the first side plates is bigger than a height of the second side plates, and
   the guide device includes a support plate formed under the bottom plate and in contact with a leading edge of the bottom plate.

2. The wafer cassette according to claim 1, wherein:
   the card slots in each group are formed at the same height; and
   the guide slots in each group are formed at the same height.

3. The wafer cassette according to claim 2, wherein:
   the number of the card slots in each group is two;
   the card slots in each group are configured facing toward each other;
   the number of the guide slots in each group is two; and
   the guide slots in each group are configured facing toward each other.

4. The wafer cassette according to claim 3, wherein:
   the guide slots are configured to be docked to the wafer input terminals along a longitudinal direction of the card slots.

5. The wafer cassette according to claim 4, wherein:
   a length of the guide slots is approximately 0.5-1.5 times of a length of the card slots.

6. The wafer cassette according to claim 1, wherein:
   a distance between the guide slots in adjacent heights is the same as a distance between the card slots in adjacent heights.

7. The wafer cassette according to claim 1, wherein:
   the number of groups of the guide slots is equal to the number of groups of the card slots.

8. The wafer cassette according to claim 1, wherein:
   the guide slots include front-guide and back-guide terminals configured on opposite sides; and
   the back-guide terminal is configured to be docked to the wafer input terminal.

9. The wafer cassette according to claim 1, wherein:
   the box body includes a semi-closed box body and a window;

the semi-closed box body is formed by a box bottom layer, a box top layer configured facing toward the box bottom layer, and the box sidewalls formed between and in contact with the box bottom layer and the box top layer; and the window is formed between the box bottom layer and the box top layer.

10. The wafer cassette according to claim 9, wherein:
the bottom plate configured to accommodate the box body, wherein an upper surface of the bottom plate is configured in contact with the box bottom layer.

11. The wafer cassette according to claim 10, wherein:
the first guide plates are formed on the bottom plate and configured to be docked to the box sidewalls at a side of the window, wherein the guide slots are formed on inner sidewalls of the first guide plates.

12. The wafer cassette according to claim 10, wherein:
the side plates are formed on the bottom plate and configured to hold the box body, wherein inner sidewalls of the side plates are configured in contact with the box sidewalls.

13. The wafer cassette according to claim 12, wherein:
the box body is a square body;
the box sidewalls of the box body include first box sidewalls and a second box sidewall, wherein the first box sidewalls are formed at both sides of the second box sidewall and perpendicular to the second box sidewall;
the first box sidewall is configured at a side of the window; and
the second box sidewall is configured facing toward the window.

14. The wafer cassette according to claim 13, wherein:
the first side plates are formed on the bottom plate, wherein inner sidewalls of the first side plates are configured in contact with the first box sidewalls.

15. The wafer cassette according to claim 14, wherein:
the second side plates are formed on the bottom plate, wherein inner sidewalls of the second side plates are configured in contact with the second box sidewall.

16. The wafer cassette according to claim 10, wherein:
the support plate is configured to set the bottom plate in one side toward the window higher than the bottom plate in the other side configured facing toward the window after accommodating the box body by the bottom plate.

17. The wafer cassette according to claim 16, wherein:
the bottom plate includes the leading edge and a trailing edge configured on opposite sides; and
the window is configured facing toward the leading edge.

18. The wafer cassette according to claim 17, wherein:
an angle between the bottom plate and a horizontal plane is in a range of approximately 25 degrees-35 degrees.

19. A method of placing wafers, comprising:
providing a plurality of wafers;
providing a wafer cassette, the wafer cassette including:
a box body, including a plurality of groups of card slots formed on sidewalls of the box body, wherein each group of the card slots is configured to hold a wafer and includes a wafer input terminal;
a guide device, including a plurality of groups of guide slots configured to be docked to the wafer input terminals, wherein each group of the guide slots and a docking group of the card slots are formed at a same height, wherein:
the guide device includes a bottom plate,
the guide device includes first guide plates and side plates, wherein:
the side plates include first side plates and second side plates on top of the bottom plate,
a height of the first guide plates is bigger than a height of the first side plates, and
a height of the first side plates is bigger than a height of the second side plates, and
the guide device includes a support plate formed under the bottom plate and in contact with a leading edge of the bottom plate;
sliding the one of the plurality of wafers onto a corresponding one of the plurality of groups of card slots through the one of the plurality of groups of guide slots by tilting the guide device; and
repeating the steps of placing another one of the plurality of wafers on another one of the plurality of groups of guide slots and sliding the another one of the plurality of wafers onto a next corresponding another one of the plurality of groups of card slots until all of the plurality of wafers are placed on the plurality of card slots.

20. The method of placing wafers according to claim 19, wherein:
the guide device is tilted by an angle in a range of approximately 25 degrees-35 degrees.

* * * * *